(12) United States Patent  (10) Patent No.: US 7,675,730 B2
Walther et al.  (45) Date of Patent: Mar. 9, 2010

(54) TECHNIQUES FOR DETECTING WAFER CHARGING IN A PLASMA PROCESSING SYSTEM

(75) Inventors: Steven R. Walther, Andover, MA (US); Bon-Woong Koo, Andover, MA (US); Bernard Gregory Lindsay, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 507 days.

(21) Appl. No.: 11/767,730

(22) Filed: Jun. 25, 2007

(65) Prior Publication Data

US 2008/0314731 A1 Dec. 25, 2008

(51) Int. Cl.
*H01L 23/00* (2006.01)
(52) U.S. Cl. .................................................. 361/225
(58) Field of Classification Search .................. 361/225
See application file for complete search history.

(56) References Cited

U.S. PATENT DOCUMENTS 6,313,428 B1 11/2001 Chen et al.
6,614,051 B1 9/2003 Shawming
7,087,913 B2 * 8/2006 Goldberg et al. ........ 250/492.21
7,453,059 B2 * 11/2008 Koo et al. .................... 250/287

FOREIGN PATENT DOCUMENTS

KR 10-2006-0060536 A 1/2008

* cited by examiner

*Primary Examiner*—Stephen W Jackson

(57) ABSTRACT

Techniques for detecting wafer charging in a plasma processing system are disclosed. In one particular exemplary embodiment, the techniques may be realized as an apparatus for detecting wafer charging in a plasma processing system. The apparatus may comprise a plasma chamber to produce a plasma discharge above a wafer in the plasma chamber. The apparatus may also comprise a biasing circuit to bias the wafer to draw ions from the plasma discharge towards the wafer. The apparatus may further comprise a detection mechanism to detect charge buildup on the wafer by measuring an electric field in one or more designated locations near a top surface of the wafer.

44 Claims, 8 Drawing Sheets

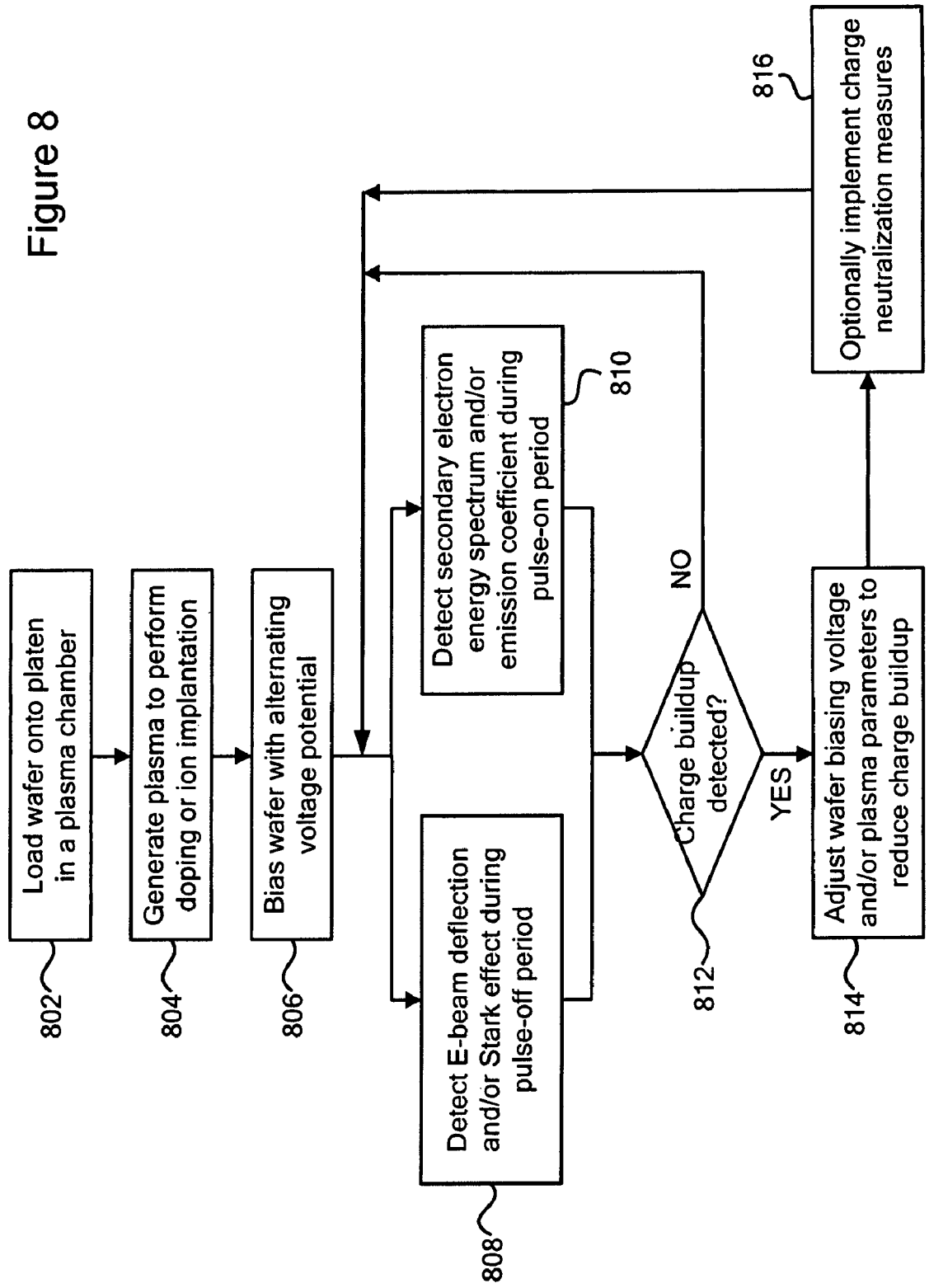

TECHNIQUES FOR DETECTING WAFER CHARGING IN A PLASMA PROCESSING SYSTEM

FIELD OF THE DISCLOSURE

The present disclosure relates generally to semiconductor manufacturing and, more particularly, to techniques for detecting wafer charging in a plasma processing system.

BACKGROUND OF THE DISCLOSURE

Plasma doping (PLAD), also referred to as plasma immersion ion implantation (PIII), is a well known technique for implanting dopants into a substrate.

FIG. 1 shows a typical PLAD system 100. The system 100 may comprise a process chamber 102 having a platen 104 to hold a wafer 12. One or more reactive gases may be fed into the process chamber 102 via a gas inlet 106 through a top plate 108. The reactive gas(es) may then be distributed uniformly through a gas baffle 110 before entering the process chamber 102. A group of coils 112 may couple radio frequency (RF) electrical power into the process chamber 102 through an aluminum oxide ($Al_2O_3$) window 114. The RF power may produce a dopant-containing plasma discharge 10 from the reactive gas(es). A bias voltage may be applied to the wafer 12 or the platen 104 to draw charged particles from the plasma discharge 10. Typically, the wafer 10 is biased with pulsed DC voltage while the plasma is always on. As a result, dopant ions are extracted into the wafer only during the pulse-on period.

Ideally, excessive charged particles delivered to a wafer should be promptly neutralized by electrons supplied from a plasma discharge. Unfortunately, the electrical contact between the wafer and the platen may be a poor one, and the wafer may have electrically isolated portions (e.g., oxide, nitride, and/or photoresist), both of which may contribute to charge buildup on the wafer. If a sufficient amount of charge is collected on the wafer, there may be enough potential difference between the wafer substrate and other cathode components to cause arcing in the plasma chamber, which is extremely damaging to microelectronic devices.

Existing methods for detecting wafer charging are mostly developed for beam-line type ion implanters and are not suitable for PLAD or other plasma-based systems. One existing approach employs wafer potential probes which are unreliable because they suffer from the same problem of poor electrical contact as wafer backside contacts. Another approach involves localized detection of photoresist outgassing, which only senses conditions conducive to arcing but does not directly measure wafer potential (or changes thereof) in a reliable way.

In view of the foregoing, it may be understood that there are significant problems and shortcomings associated with current wafer charging detection technologies.

SUMMARY OF THE DISCLOSURE

Techniques for detecting wafer charging in a plasma processing system are disclosed. In one particular exemplary embodiment, the techniques may be realized as an apparatus for detecting wafer charging in a plasma processing system. The apparatus may comprise a plasma chamber to produce a plasma discharge above a wafer in the plasma chamber. The apparatus may also comprise a biasing circuit to bias the wafer to draw ions from the plasma discharge towards the wafer. The apparatus may further comprise a detection mechanism to detect charge buildup on the wafer by measuring an electric field in one or more designated locations near a top surface of the wafer.

In another particular exemplary embodiment, the techniques may be realized as a method for detecting wafer charging in a plasma processing system. The method may comprise the step of generating a plasma discharge above a wafer. The method may also comprise the step of biasing the wafer to draw ions from the plasma discharge. The method may further comprise the step of detecting charge buildup on the wafer by measuring an electric field in one or more designated locations near a top surface of the wafer.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a complete understanding of the present disclosure, reference is now made to the accompanying drawings, in which like elements are referenced with like numerals. These drawings should not be construed as limiting the present disclosure, but are intended to be exemplary only.

FIG. 8 shows a flow chart illustrating an exemplary method for detecting and controlling wafer charging in a plasma processing system in accordance with an embodiment of the present disclosure.

DETAILED DESCRIPTION OF EXEMPLARY EMBODIMENTS

Embodiments of the present disclosure provide a number of techniques for wafer charging detection in a PLAD or other plasma-based systems. Based on these techniques, charge buildup on a wafer substrate may be reliably detected so as to prevent conditions that may cause arcing on or near the wafer. An electric field (or a plasma sheath) in one or more designated locations near the wafer surface may be sensed to provide a direct indication as to whether and/or to what extent a charge buildup condition exists. The wafer charging detection may also be based on the sensing of changes in the electric field (or plasma sheath). Preferably, the detection is performed without making any physical contact to a wafer. When a wafer is biased with a pulsed voltage potential, charge buildup conditions may be detected during pulse-off and/or pulse-on periods. Detection of charge buildup conditions may enable a feedback control of wafer biasing, charge neutralization, and/or plasma generation.

Figure 1:
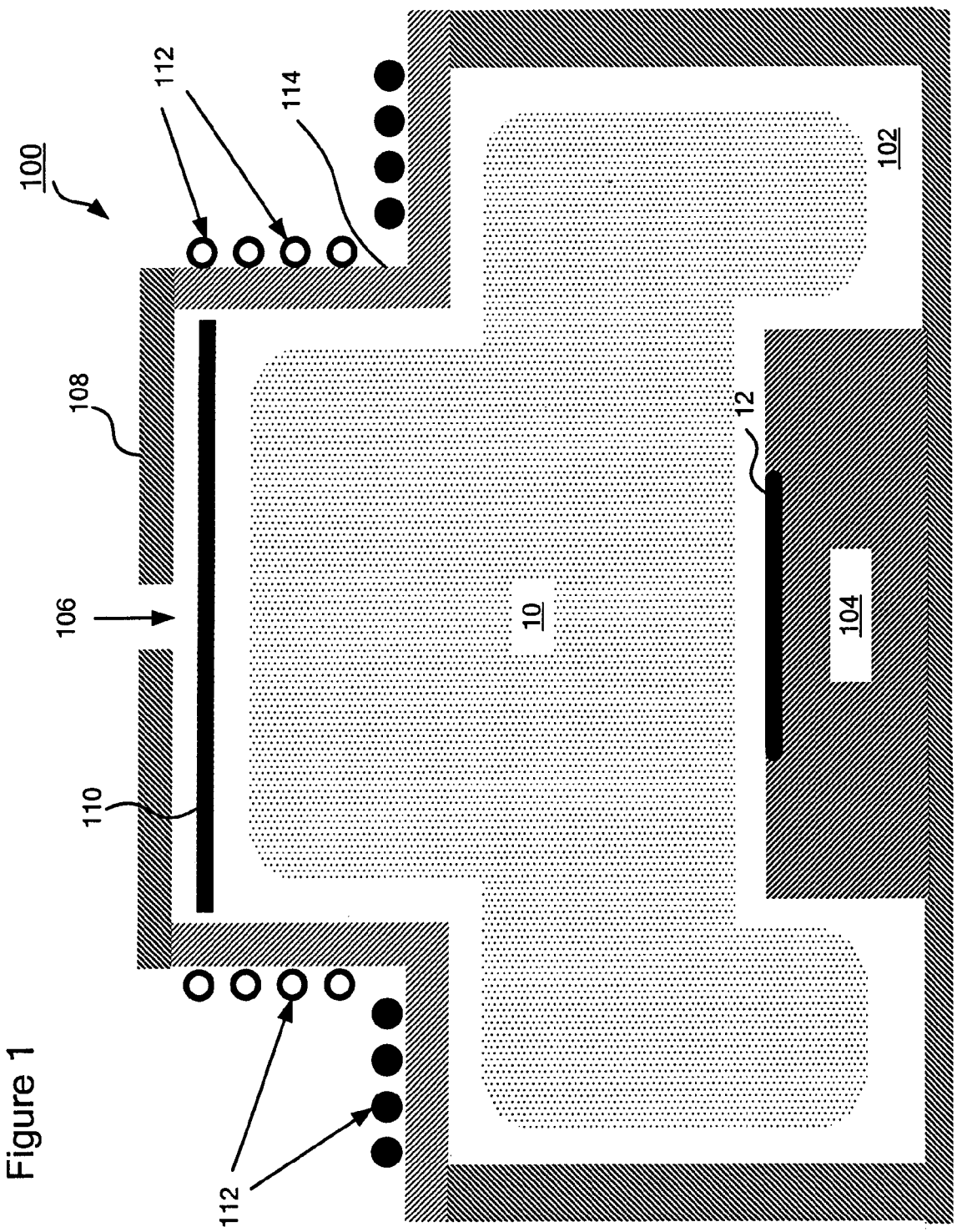
FIG. 1 shows a typical PLAD system.
Figure 2A:
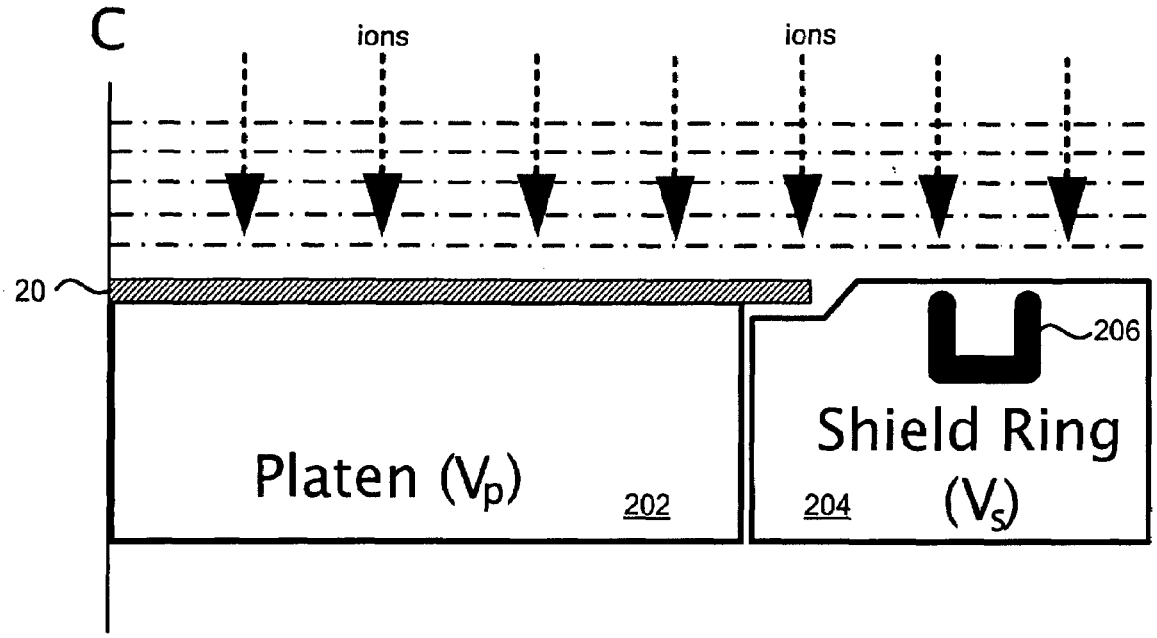
FIGS. 2A and 2B illustrate how an electric field profile near a wafer changes as a result of charge buildup on the wafer.
Figure 2B:
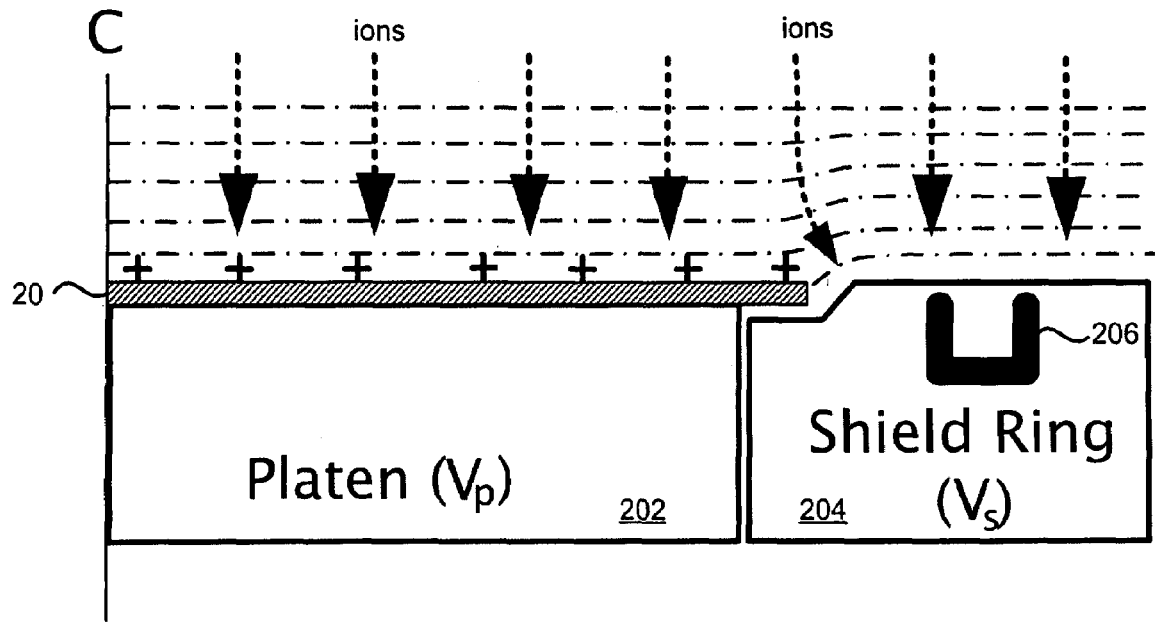

FIGS. 2A and 2B illustrate how an electric field profile near a wafer 20 changes as a result of charge buildup on the wafer 20. Only a cross-section of one half of the wafer 20 is shown in FIGS. 2A and 2B. The wafer 20 may be held on a platen 202 and surrounded by a shield ring 204. The shield ring 204 is typically made of doped silicon, metal or other conductive materials. The shield ring 204 may comprise or be coupled to a Faraday cup 206 which measures ion doses.

FIG. 2A shows an electric field profile when there is no charge buildup on the wafer 20. The platen 202 may be biased at a first voltage potential ($V_P$), and the shield ring 204 may be biased at a second voltage potential ($V_S$), wherein $V_P=V_S$. The Faraday cup 206 may have a voltage potential $V_F$ that is the same as $V_S$. In this ideal case shown in FIG. 2A, there is no charge buildup on the wafer 20. As a result, the substrate of the wafer 20 is at a voltage potential ($V_W$) that is the same as the platen 202, the shield ring 204, and the Faraday cup 206 (i.e., $V_P=V_S=V_F=V_W$). Equipotential lines (represented with dot-dash lines) of the electric field near the top surface of the wafer 20 may be in parallel with one another.

FIG. 2B shows an electric field profile when there is significant charge buildup on the wafer 20. When positive charges are collected on the wafer 20, the charge buildup may distort the electric field near the top surface of the wafer 20 and/or around the edges of the wafer 20. That is, the wafer 20 may now be at a voltage potential $V_W$ that is the different from the platen 202, the shield ring 204, or the Faraday cup 206 (i.e., $V_P=V_S=V_F \ne V_W$). Although this voltage difference may be too small to detect or measure, one or more small changes in the electric field may be sensed with various techniques to determine the presence of charge buildup conditions, as will be described in detail below.

Figure 3:
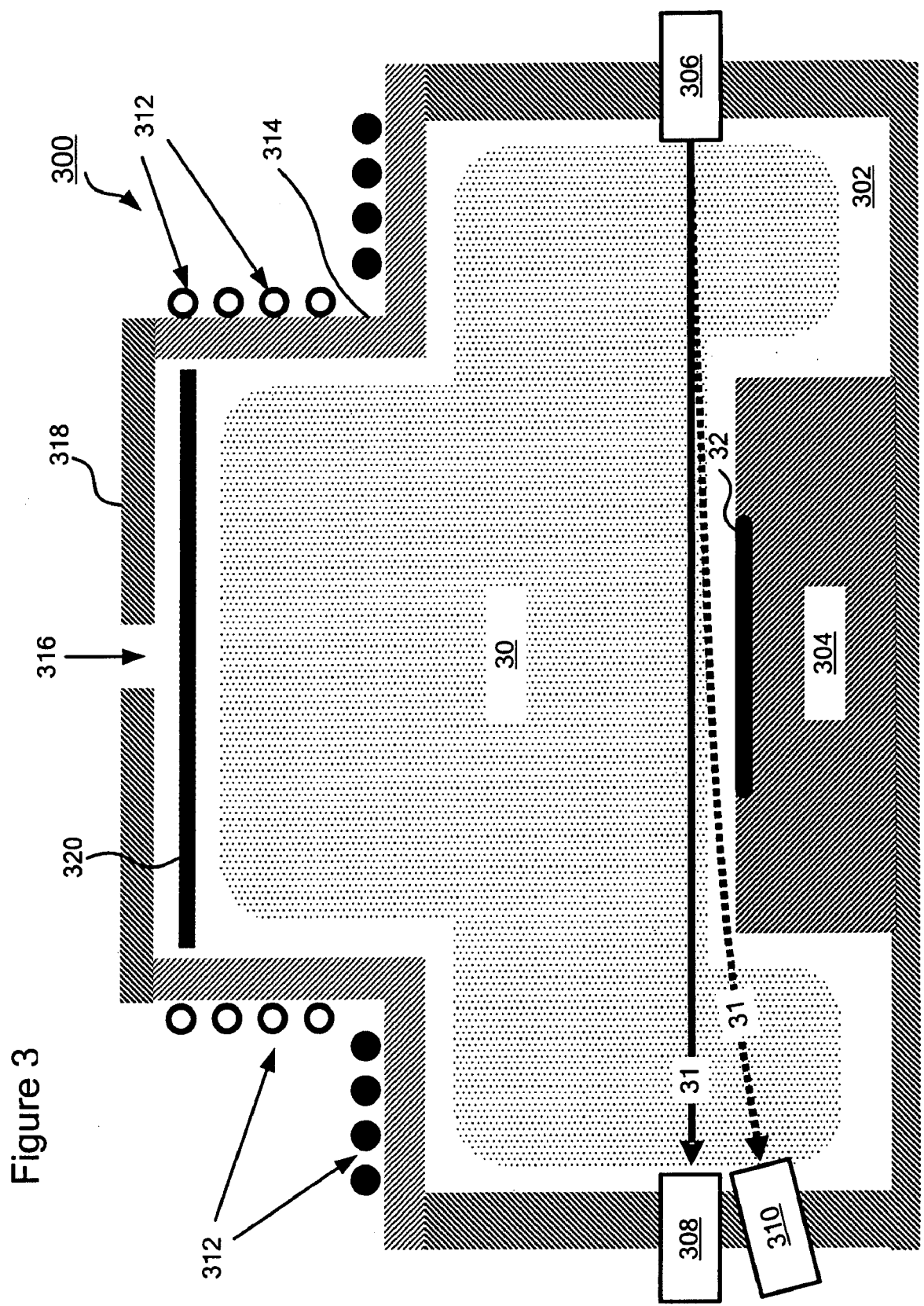
FIG. 3 illustrates an exemplary method for detecting wafer charging based on electron beam (E-beam) deflection in accordance with an embodiment of the present disclosure.

FIG. 3 illustrates an exemplary method for detecting wafer charging based on electron beam (E-beam) deflection in accordance with an embodiment of the present disclosure.

The exemplary method may be implemented in a PLAD system 300. The system 300 may comprise a process chamber 302 in which a platen 304 holds a wafer 32. The system 300 may comprise a process chamber 302 having a platen 304 to hold a wafer 32. One or more reactive gases may be fed into the process chamber 302 via a gas inlet 316 through a top plate 318. The reactive gas(es) may then be distributed uniformly through a gas baffle 320 before entering the process chamber 302. A group of coils 312 may couple radio frequency (RF) electrical power or microwave power into the process chamber 302 through an aluminum oxide ($Al_2O_3$) window 314. The RF power may produce a dopant-containing plasma discharge 30 from the reactive gas(es). A bias voltage may be applied to the wafer 32 and/or the platen 304 to draw charged particles from the plasma discharge 30. Typically, the wafer 30 is biased with a pulsed voltage potential so as to attract positive dopant ions from the plasma discharge 30 during negative pulses of the pulsed voltage potential. The wafer 32 may be biased with a pulsed DC voltage (e.g., with a modulated square wave) such that positive ions are drawn from the plasma discharge 30 towards the wafer 32 during pulse-on periods.

It should be noted that, although most exemplary embodiments are described in the context of plasma charges producing positive dopant ions, the present disclosure is not limited to detecting wafer charging from positive ions. The same operating principles also apply to the detection of charge buildup caused by negative ions or electrons.

To monitor an electric field near a top surface of the wafer 32, an electron beam (E-beam) gun 306 (or a similar device) may be positioned on one side of the wafer 32. Preferably, the E-beam gun 306 may be located on or coupled through a sidewall of the process chamber 302 (e.g., through a view port). The E-beam gun 306 may be used to inject an E-beam 31 above the top surface of the wafer 32, preferably in parallel with the top surface. The trajectory of the E-beam 31 may be sufficiently close to the wafer 32 to be affected by any charge buildup thereon.

If there is no significant charge buildup on the wafer 32, the E-beam 31 may follow its normal trajectory and be detected by an electron detector 308 positioned on the other side of the wafer 32. The position of the electron detector 308 may have been calibrated to count a maximum number of electrons (or a maximum E-beam current) from the E-beam 31 as it traverses the process chamber 302 without any deflection.

However, if positive charges are accumulated on the wafer 32, the otherwise evenly distributed electric field lines near the top surface of the wafer may be perturbed or distorted. As a result, electrons in the E-beam 31 may deviate from its normal trajectory. Thus, fewer electrons may be detected by the electron detector 308. Instead, some electrons may be detected by an electron detector 310 positioned below the electron detector 308. The electron detector 308 may be stationary while the electron detector 310 may be a mobile one that can be translated and/or tilted (e.g., in up and down directions). According to one embodiment, the amount of charge buildup on the wafer 32 may be determined based on how far the electron detector 310 has been moved away from the electron detector 308 to detect or get a maximum reading from a deflected E-beam 31. According to one embodiment, the amount of charge buildup may also be estimated based on readings from the electron detectors 308 and 310 and their relative positions. The electron detector 310 may also be moved horizontally on either side of the electron detector 308 to detect E-beam deflections in a horizontal plane.

Alternatively, only one electron detector 308 may be used to detect electrons from the E-beam 31. For example, the electron detector 308 may be initially in a calibrated position where it receives a maximum number of electrons from an un-deflected E-beam 31. When charge buildup occurs, the electron count (or E-beam current) measurement at the electron detector 308 may start to decrease. In response, the electron detector 308 may be moved up or down until it reaches a location where the deflected E-beam 31 is fully or partially detected again. The farther the electron detector 308 has to move to re-detect the E-beam 31, the more charge buildup there is on the wafer 32.

Whether a single electron detector or multiple electron detectors are used, their readings and/or positions may be pre-calibrated (e.g., based on experiments or prior data) to provide a meaningful interpretation of detection results. For example, pre-calibration may allow a determination of whether charge buildup is present on the wafer 32 and how likely the continued charge buildup will lead to arcing.

According to some embodiments of the present disclosure, the exemplary method as illustrated in FIG. 3 is preferably implemented to detect wafer charging during one or more "pulse-off" periods when the wafer 32 is not biased to attract positive ions from the plasma discharge 30 and no plasma sheath surrounds the wafer 32 or the platen 304.

Figure 4:
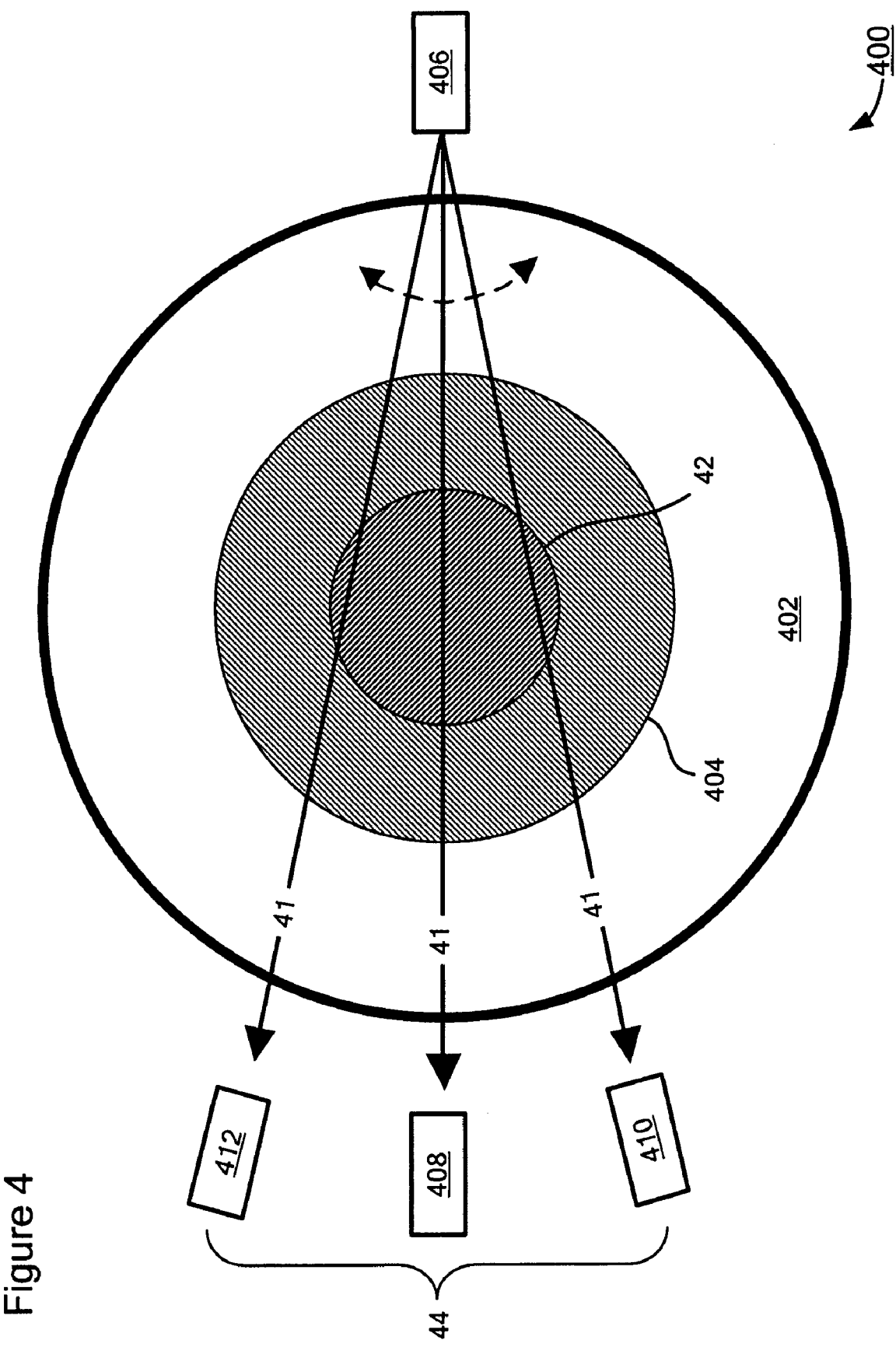
FIG. 4 illustrates another exemplary method for detecting wafer charging based on E-beam deflection in accordance with an embodiment of the present disclosure.

FIG. 4 illustrates another exemplary method for detecting wafer charging based on E-beam deflection in accordance with an embodiment of the present disclosure. FIG. 4 is a top view of a PLAD system 400 which may be the same as or similar to the system 300 shown in FIG. 3. The system 400 may comprise a process chamber 402 in which a platen 404 holds a wafer 42. For clarity, no plasma discharge is shown in FIG. 4.

An E-beam gun 406 may be positioned on one side the wafer 42, in a similar fashion as the E-beam gun 306 described above. However, instead of being stationary like the E-beam gun 306, the E-beam gun 406 may radially scan an E-beam 41 above different portions of the wafer 42. A detector assembly 44 (e.g., with electron detectors 408, 410, and 412) may be deployed on the other side of the wafer 42 to detect the scanned E-beam 41. With multiple lines of sight, as established by the scanned E-beam 41, the entire surface of the wafer 42 may be surveyed and monitored for charge buildup conditions. According to some embodiments, the E-beam 41 may also be scanned outside the wafer 42, for example, over the platen 404 or a shield ring (not shown). Since there is typically no charge buildup on either the platen 404 or the shield ring, measurement readings from the E-beam 41 traversing those off-wafer areas may be used as a reference in interpreting measurement readings from the E-beam 41 traversing the wafer area (42).

Figure 5:
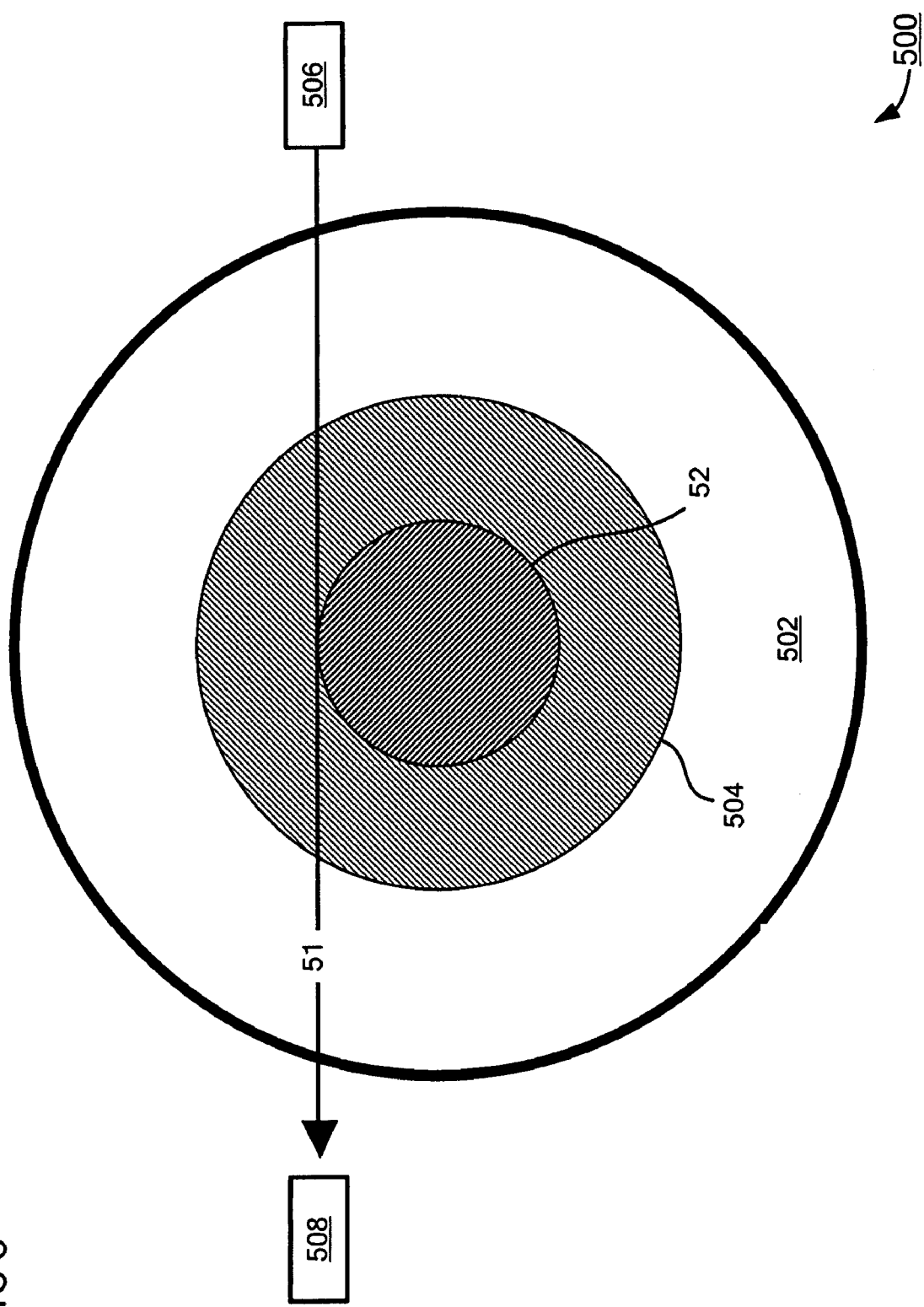
FIG. 5 illustrates yet another exemplary method for detecting wafer charging based on E-beam deflection in accordance with an embodiment of the present disclosure.

FIG. 5 illustrates yet another exemplary method for detecting wafer charging based on E-beam deflection in accordance with an embodiment of the present disclosure. FIG. 5 is a top view of a PLAD system 500 which may be the same as or similar to the system 300 shown in FIG. 3. The system 500 may comprise a process chamber 502 in which a platen 504 holds a wafer 52. For clarity, no plasma discharge is shown in FIG. 5. In this exemplary configuration, an E-beam gun 506 may be set up to shoot an E-beam 51 between an edge of the wafer 52 and the platen 502. One or more electron detectors 508 may be positioned on the other side of the wafer 52 to detect the E-beam 51.

During a pulse-off period, an interface layer with a high density of positive ions, known as a "plasma sheath," is formed between a plasma discharge and the wafer 52 and the platen 504 (and a shield ring (not shown)). A thickness of the plasma sheath is related to a potential difference across it. If the wafer 52 has a voltage potential different from the platen 504 (or the shield ring), the plasma sheath thickness may vary radially at the wafer edges. By setting up the E-beam gun 506 and the electron detector(s) 508, the system 500 may measure a change in the plasma sheath thickness based on electron deflections.

According to other embodiments of the present disclosure, the plasma sheath thickness and/or changes thereof may also be detected by sensing collimated optical emissions from the plasma sheath with an optical detector.

Figure 6:
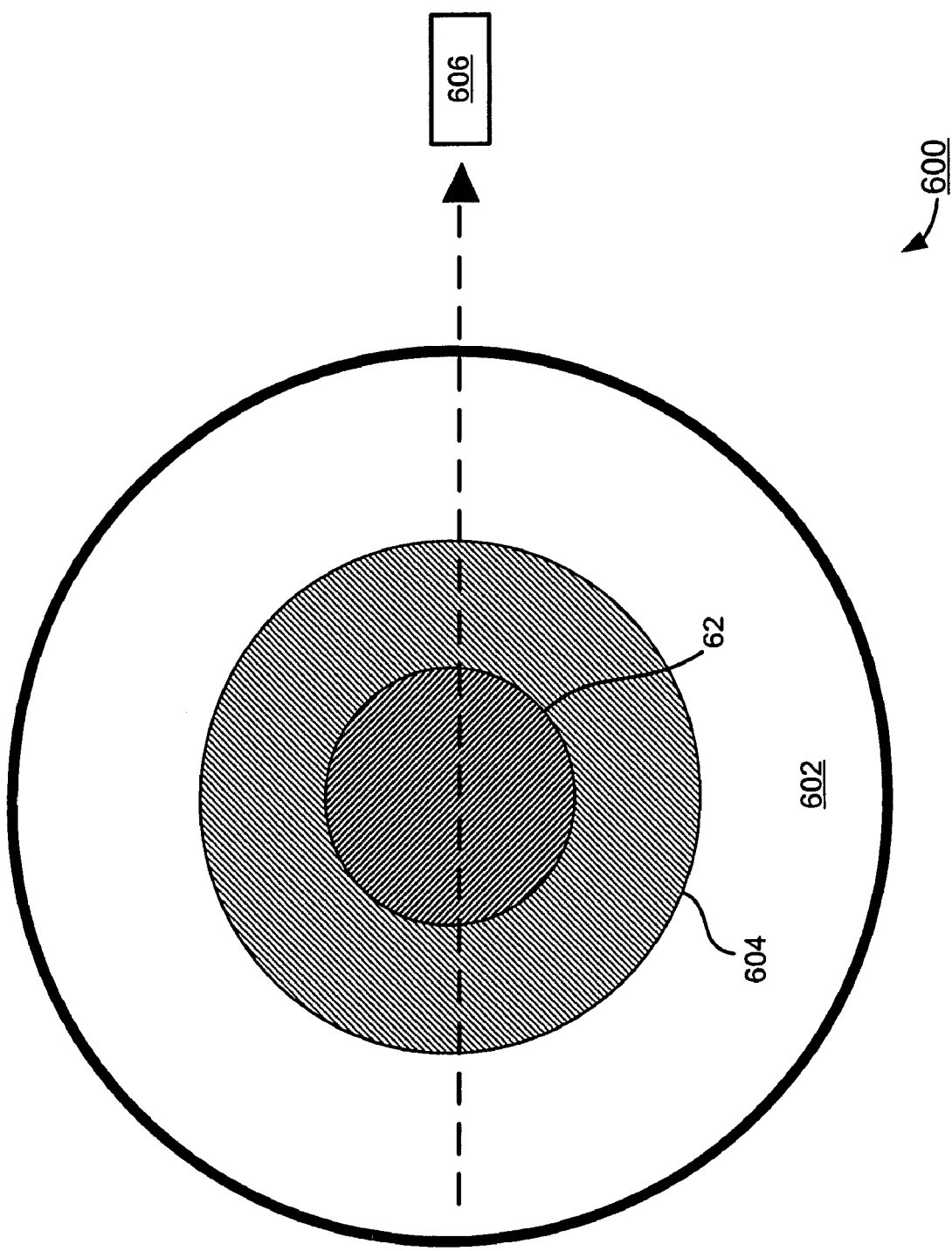
FIG. 6 illustrates an exemplary method for detecting wafer charging based on Stark effect in accordance with an embodiment of the present disclosure.

FIG. 6 illustrates an exemplary method for detecting wafer charging based on Stark effect in accordance with an embodiment of the present disclosure. FIG. 6 is a top view of a PLAD system 600 which may be the same as or similar to the system 300 shown in FIG. 3. The system 600 may comprise a process chamber 602 in which a platen 604 holds a wafer 62. For clarity, no plasma discharge is shown in FIG. 6.

Stark effect is the shifting and splitting of spectral lines of atoms and molecules due to the presence of an external static electric field. Charge buildup may cause residual potential on the wafer 62 during a pulse-off period. The resulting change in electric field may be detected by measuring Stark-effect spectral emissions from the plasma discharge just above a top surface of the wafer 62. One or more optical detectors 606 may be set up to capture the spectral emissions. Similar to the electron detectors described above, the optical detector(s) 606 may have an adjustable height and/or may be moved in a horizontal plane. The spectral line shifting and splitting may be calibrated to correlate to charge buildup conditions. Although FIG. 6 shows only one line of sight through the center of the wafer 62, multiple lines of sight may be established to detect the spectral emissions from various portions of the wafer 62.

Figure 7:
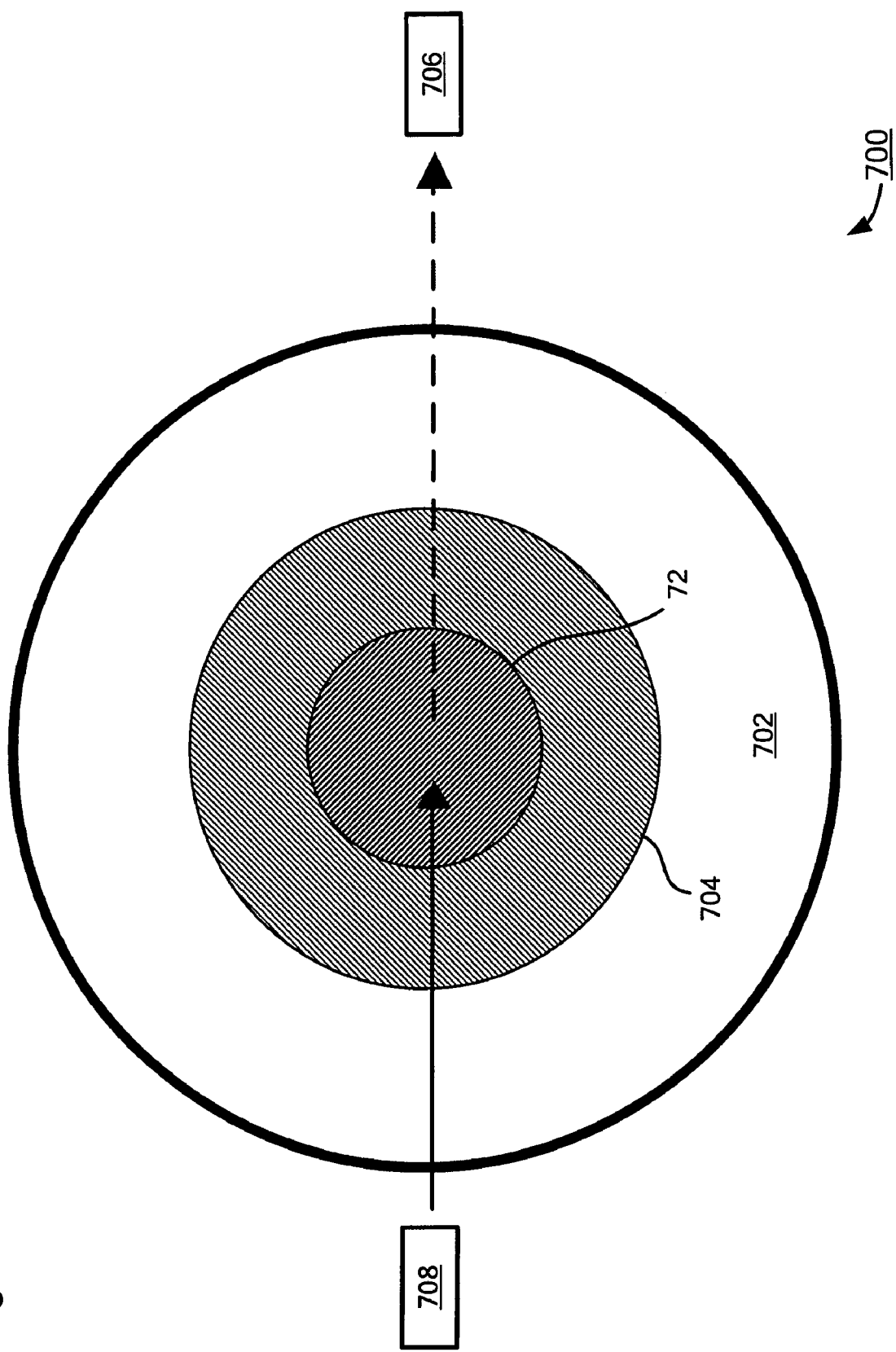
FIG. 7 illustrates another exemplary method for detecting wafer charging based on Stark effect in accordance with an embodiment of the present disclosure.

FIG. 7 illustrates another exemplary method for detecting wafer charging based on Stark effect in accordance with an embodiment of the present disclosure. FIG. 7 is a top view of a PLAD system 700 which may be the same as or similar to the system 600 shown in FIG. 6. The system 700 may comprise a process chamber 702 in which a platen 704 holds a wafer 72. For clarity, no plasma discharge is shown in FIG. 7. Compared to the system 600, the main difference shown in FIG. 7 is the inclusion of an excitation source 708 to the system 700, on an opposite side of the wafer 72 as an optical detector 706. The excitation source 708 may provide a modulated excitation of the plasma discharge just above the wafer 72, thereby enhancing Stark-effect spectral emissions detected by the optical detector 706.

The wafer charging detection methods described above are preferably implemented for pulse-off periods when a wafer is not at a negative bias. During the pulse-on period, however, it may be more advantageous to detect charge buildup conditions based on measurements related to secondary electrons from the wafer and/or other cathode components.

Secondary electrons are those electrons emitted from an object as a result of ion bombardments. In a plasma-based system, ions from a plasma discharge may strike a wafer hard enough to generate secondary electrons. The wafer is typically surrounded by a shield ring, and ions from the plasma discharge may also cause secondary electrons to emit from the shield ring. Energies of the secondary electrons emitted from the wafer and the shield ring are respectively correlated to their voltage potentials. As mentioned above, when there is no charge buildup on a wafer, the wafer will be at the same voltage potential as a corresponding platen and shield ring. Therefore, with no charge buildup, the secondary electrons from the wafer should have approximately the same energy as those from the shield ring.

If there is charge buildup on the wafer, the wafer may be at a voltage potential different from that of the shield ring, causing a shift of peak energy of secondary electrons emitted from the wafer. Based on this concept, an energy analyzer may be positioned over a wafer to measure an energy spectrum associated with secondary electrons emitted from the wafer. With reference to another energy spectrum associated with secondary electrons emitted from a shield ring, any significant peak energy shift in the secondary electrons from the wafer may be detected as an indication of charge buildup on the wafer.

Another parameter related to secondary electrons, known as a "secondary electron emission coefficient," is also dependent on a voltage potential of an emitting surface. Therefore, when charge buildup occurs on a wafer, a secondary electron emission coefficient associated with the wafer will shift with respect to another secondary electron emission coefficient associated with a shield ring that remains uncharged. This shift may be detected by measuring a ratio between a first secondary electron current emitted from the wafer and a second secondary electron current detected in the shield ring. The shield ring secondary electron current may be used as a reference for the wafer secondary electron current because the wafer secondary emission will change during charge buildup whereas the shield ring secondary emission will not. Alternatively, the shift in secondary electron emission coefficient may be detected with an external detector positioned over the wafer to directly measures secondary electron current emitted from the wafer.

FIG. 8 shows a flow chart illustrating an exemplary method for detecting and controlling wafer charging in a plasma processing system in accordance with an embodiment of the present disclosure.

In step 802, a wafer may be loaded onto a platen in a plasma-based process chamber such as a PLAD process chamber. The wafer may be electrostatically clamped to the platen and may be surrounded by a shield ring biased at the same voltage potential as the platen.

In step 804, a plasma discharge may be created from one or more reactive gases to produce desired ion species. The ion species may be implanted into the wafer either as dopants or to alter other physiochemical characteristics of the wafer.

In step 806, the wafer may be biased with a pulsed DC potential such that doping or ion implantation of the wafer may proceed in a pulsed manner. Positive ion species may be drawn to the wafer during pulse-on period.

Different techniques for wafer charging detection may be employed during pulse-off periods and pulse-on periods. For example, in step 808, charge buildup on the wafer may be detected during pulse-off periods based on E-beam deflection and/or Stark effect as described above. In step 810, charge buildup on the wafer may be detected during pulse-on periods based on the above-described measurement of secondary electron energy spectrum, secondary electron emission coefficient, and/or plasma sheath thickness. Steps 808 and 810 may be considered as somewhat concurrent and alternative steps with respect to each other because the biasing voltage on the wafer alternates continuously during each process run.

In step 812, it may be determined, based on the measurements in steps 808 and/or 810, whether charge buildup conditions are present on the wafer. If there is no charge buildup, the process may loop back to steps 808 and/or 810 to keep monitoring the wafer. If there is charge buildup detected, then, in step 814, the wafer biasing voltage and/or the plasma discharge parameters may be adjusted based on the measurements made in steps 808 and/or 810 above. According to one embodiment, charge buildup may be reduced by adjusting the duty cycles of the wafer bias. For example, by shortening the pulse-on periods and increasing the pulse-off periods, the wafer may be allowed more time to dissipate the excessive charges. Alternatively, the pulsed voltage potential on the wafer may have its frequency reduced. In addition, the plasma discharge may be tuned to slow down charge accumulation on the wafer.

If necessary, some active charge neutralization measures (e.g., electron flood guns) may be taken in step 816 to quickly neutralize excessive charges on the wafer.

At this point it should be noted that the techniques detecting wafer charging in a plasma processing system in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with wafer charging detection in accordance with the present disclosure as described above. Alternatively, one or more processors operating in accordance with stored instructions may implement the functions associated with wafer charging detection in accordance with the present disclosure as described above. If such is the case, it is within the scope of the present disclosure that such instructions may be stored on one or more processor readable carriers (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for detecting wafer charging in a plasma processing system, the apparatus comprising:
   a plasma chamber to produce a plasma discharge above a wafer in the plasma chamber;
   a biasing circuit to bias the wafer to draw ions from the plasma discharge towards the wafer; and
   a detection mechanism to detect charge buildup on the wafer by measuring an electric field in one or more designated locations near a top surface of the wafer.

2. The apparatus according to claim 1, wherein the detection mechanism is configured to detect charge buildup on the wafer without making any physical contact to the wafer.

3. The apparatus according to claim 1, wherein the wafer is biased with a pulsed voltage potential.

4. The apparatus according to claim 3, wherein the detection mechanism is configured to detect charge buildup on the wafer during one or more pulse-off periods of the pulsed voltage potential.

5. The apparatus according to claim 4, wherein the detection mechanism comprises:
   an electron beam gun to inject an electron beam near the top surface of the wafer; and
   one or more electron detectors to sense a deflection of the electron beam caused by a wafer potential that results from charge buildup on the wafer.

6. The apparatus according to claim 5, wherein the one or more electron detectors are configured to measure the electron beam current and thereby estimate an extent of the charge buildup.

7. The apparatus according to claim 5, wherein the electron beam gun is configured to inject the electron beam across different portions of the top surface of the wafer.

8. The apparatus according to claim 7, wherein the electron beam gun is configured to scan the electron beam across at least one portion of the top surface of the wafer.

9. The apparatus according to claim 7, wherein an array of electron detectors are positioned on an opposite side of the wafer with respect to the electron beam gun to detect the electron beam after it traverses the different portions of the top surface of the wafer.

10. The apparatus according to claim 5, wherein the electron beam gun is configured to inject the electron beam near an edge of the wafer to sense a potential difference between the wafer and a platen.

11. The apparatus according to claim 4, wherein the detection mechanism comprises an optical sensor to detect Stark-effect spectral emissions from a plasma sheath near the top surface of the wafer and thereby estimate an extent of the charge buildup.

12. The apparatus according to claim 11, wherein the detection mechanism further comprises an optical source for electronic excitation to enhance the Stark-effect spectral emissions.

13. The apparatus according to claim 3, wherein the detection mechanism is configured to detect charge buildup on the wafer during one or more pulse-on periods of the pulsed voltage potential.

14. The apparatus according to claim 13, wherein the detection mechanism is configured to measure an energy spectrum associated with secondary electrons emitted from the wafer.

15. The apparatus according to claim 14, wherein the detection mechanism further comprises an energy analyzer to detect an energy peak shift in the energy spectrum.

16. The apparatus according to claim 13, wherein the detection mechanism is configured to measure a change in a secondary electron emission coefficient associated with the top surface of the wafer.

17. The apparatus according to claim 1, wherein the detection mechanism is also configured to measure the electric field near a shield ring to provide a reference in the detection of charge buildup on the wafer.

18. The apparatus according to claim 3, further comprising:
a feedback control mechanism to change the plasma discharge or the pulsed voltage potential based on the detection of charge buildup on the wafer.

19. The apparatus according to claim 18, wherein the feedback control mechanism is configured to reduce a pulse width of the pulsed voltage potential upon the detection of substantial charge buildup on the wafer.

20. The apparatus according to claim 18, wherein the feedback control mechanism is configured to reduce a frequency of the pulsed voltage potential upon the detection of substantial charge buildup on the wafer.

21. The apparatus according to claim 18, wherein the feedback control mechanism is configured to reduce a pulse width of the pulsed voltage potential and increase a frequency of the pulsed voltage potential upon the detection of substantial charge buildup on the wafer, thereby reducing wafer charging but maintaining a production throughput.

22. A method for detecting wafer charging in a plasma processing system, the method comprising the steps of:
generating a plasma discharge above a wafer;
biasing the wafer to draw ions from the plasma discharge; and
detecting charge buildup on the wafer by measuring an electric field in one or more designated locations near a top surface of the wafer.

23. The method according to claim 22, wherein the charge buildup on the wafer is detected without making any physical contact to the wafer.

24. The method according to claim 22, further comprising: biasing the wafer with a pulsed voltage potential.

25. The method according to claim 24, wherein the charge buildup on the wafer is detected during one or more pulse-off periods of the pulsed voltage potential.

26. The method according to claim 25, further comprising:
injecting an electron beam near the top surface of the wafer; and
sensing a deflection of the electron beam caused by a wafer potential that results from charge buildup on the wafer.

27. The method according to claim 26, wherein the one or more electron detectors are configured to measure the electron beam current and thereby estimate an extent of the charge buildup.

28. The method according to claim 26, wherein the electron beam is injected across different portions of the top surface of the wafer.

29. The method according to claim 28, wherein the electron beam is scanned across at least one portion of the top surface of the wafer.

30. The method according to claim 28, wherein an array of electron detectors are used to detect the electron beam after it traverses the different portions of the top surface of the wafer.

31. The method according to claim 26, wherein the electron beam is injected near an edge of the wafer to sense a potential difference between the wafer and a platen.

32. The method according to claim 25, further comprising:
detecting Stark-effect spectral emissions from a plasma sheath near the top surface of the wafer and thereby estimate an extent of the charge buildup.

33. The method according to claim 32, further comprising:
using an optical source for electronic excitation to enhance the Stark-effect spectral emissions.

34. The method according to claim 24, further comprising:
detecting charge buildup on the wafer during one or more pulse-on periods of the pulsed voltage potential.

35. The method according to claim 34, further comprising:
measuring an energy spectrum associated with secondary electrons emitted from the wafer.

36. The method according to claim 35, further comprising:
using an energy analyzer to detect an energy peak shift in the energy spectrum.

37. The method according to claim 34, further comprising:
measuring a change in a secondary electron emission coefficient associated with the top surface of the wafer.

38. The method according to claim 22, further comprising:
measuring the electric field near a shield ring to provide a reference in the detection of charge buildup on the wafer.

39. The method according to claim 24, further comprising:
providing feedback control to change the plasma discharge or the pulsed voltage potential based on the detection of charge buildup on the wafer.

40. The method according to claim 39, further comprising:
reducing a pulse width of the pulsed voltage potential upon the detection of substantial charge buildup on the wafer.

41. The method according to claim 39, further comprising:
reducing a frequency of the pulsed voltage potential upon the detection of substantial charge buildup on the wafer.

42. The method according to claim 39, further comprising:
reducing a pulse width of the pulsed voltage potential while increasing a frequency of the pulsed voltage potential upon the detection of substantial charge buildup on the wafer, thereby reducing wafer charging but maintaining a production throughput.

43. At least one signal embodied in at least one carrier wave for transmitting a computer program of instructions configured to be readable by at least one processor for instructing the at least one processor to execute a computer process for performing the method as recited in claim 22.

44. At least one processor readable carrier for storing a computer program of instructions configured to be readable by at least one processor for instructing the at least one processor to execute a computer process for performing the method as recited in claim 22.

* * * * *